(12) United States Patent
Bertram et al.

(10) Patent No.: US 8,619,211 B2
(45) Date of Patent: Dec. 31, 2013

(54) LIGHTING DEVICE, BACKLIGHTING DEVICE, AND DISPLAY DEVICE

(75) Inventors: Ralph Peter Bertram, Nittendorf (DE);
David Dussault, Regensburg (DE);
Matthias Fiegler, München (DE);
Harald Stoyan, Regensburg (DE)

(73) Assignee: OSRAM Gesellschaft mit beschrankter Haftung, Munich (DE)

( * ) Notice: Subject to any disclaimer, the term of this patent is extended or adjusted under 35 U.S.C. 154(b) by 386 days.

(21) Appl. No.: 12/601,526

(22) PCT Filed: May 20, 2008

(86) PCT No.: PCT/DE2008/000838
§ 371 (c)(1),
(2), (4) Date: May 20, 2010

(87) PCT Pub. No.: WO2008/141625
PCT Pub. Date: Nov. 27, 2008

(65) Prior Publication Data
US 2010/0277666 A1    Nov. 4, 2010

(30) Foreign Application Priority Data
May 22, 2007 (DE) .......................... 10 2007 023 651

(51) Int. Cl.
*G02F 1/1335* (2006.01)
*F21V 21/00* (2006.01)
(52) U.S. Cl.
USPC ........................................... 349/61; 362/240
(58) Field of Classification Search
None
See application file for complete search history.

(56) References Cited

U.S. PATENT DOCUMENTS

| | | | |
|---|---|---|---|
| 5,404,282 A | 4/1995 | Klinke et al. | |
| 5,412,313 A | 5/1995 | Martin | |
| 5,519,596 A | 5/1996 | Woolverton | |
| 6,111,272 A | 8/2000 | Heinen | |
| 6,283,612 B1 * | 9/2001 | Hunter | 362/240 |
| 6,299,337 B1 | 10/2001 | Bachl et al. | |
| 6,659,623 B2 * | 12/2003 | Friend | 362/249.06 |
| 7,210,818 B2 | 5/2007 | Luk et al. | |
| 2003/0071581 A1 | 4/2003 | Panagotacos et al. | |
| 2005/0213321 A1 | 9/2005 | Lin | |
| 2006/0133076 A1 | 6/2006 | Sloan et al. | |
| 2006/0292722 A1 | 12/2006 | Becker et al. | |
| 2008/0111471 A1 | 5/2008 | Blumel et al. | |

FOREIGN PATENT DOCUMENTS

| | | |
|---|---|---|
| CN | 1270111 A | 10/2000 |
| DE | 199 09 399 C1 | 1/2001 |
| DE | 102 54 662 A1 | 6/2004 |
| DE | 20 2005 000 778 U1 | 5/2005 |

(Continued)

OTHER PUBLICATIONS

Examination Report dated Aug. 24, 2012 issued in the corresponding Chinese patent application.

*Primary Examiner* — Tina Wong
(74) *Attorney, Agent, or Firm* — Cozen O'Connor

(57) ABSTRACT

A lighting arrangement is disclosed with a light module (2) that has at least one first group (22, 22') of light sources (221, 222, 223) and one second group (22, 22") of light sources that are arranged spaced apart from each other on a flexible circuit board (21), and with a carrier (1) on which the light module is mounted, and a buffer zone (12) that laterally overlaps with the light module between the first and the second group of light sources. Furthermore, a backlighting device and a display device are disclosed.

18 Claims, 5 Drawing Sheets

(56) References Cited

FOREIGN PATENT DOCUMENTS

| | | |
|---|---|---|
| DE | 10 2006 033 894 A1 | 6/2007 |
| EP | 0 905 797 A2 | 8/1998 |
| EP | 1 033 525 | 9/2000 |
| GB | 2 361 988 A | 11/2001 |
| WO | WO 92/13281 | 8/1992 |
| WO | WO 2006/076899 A2 | 7/2006 |

* cited by examiner

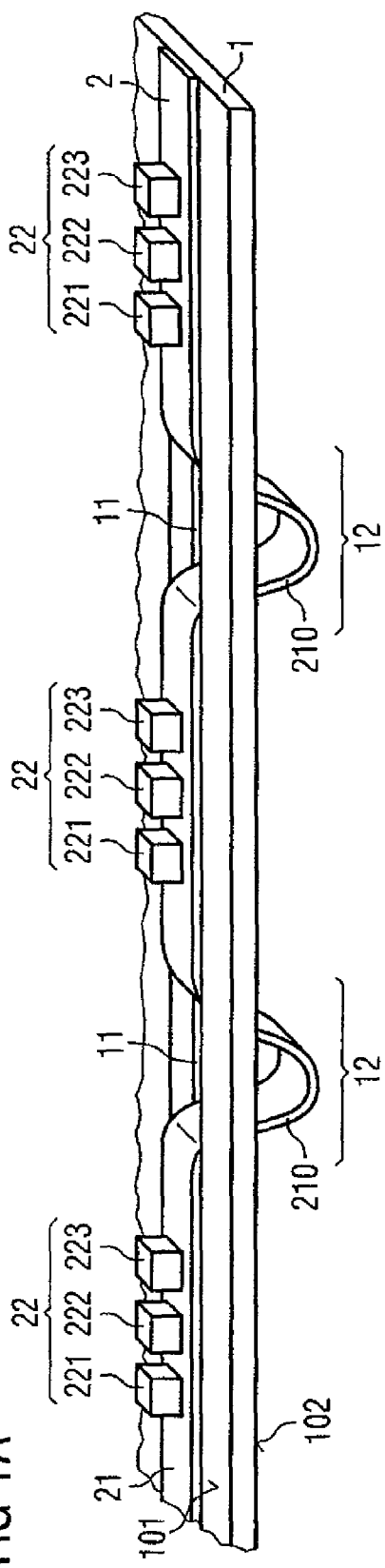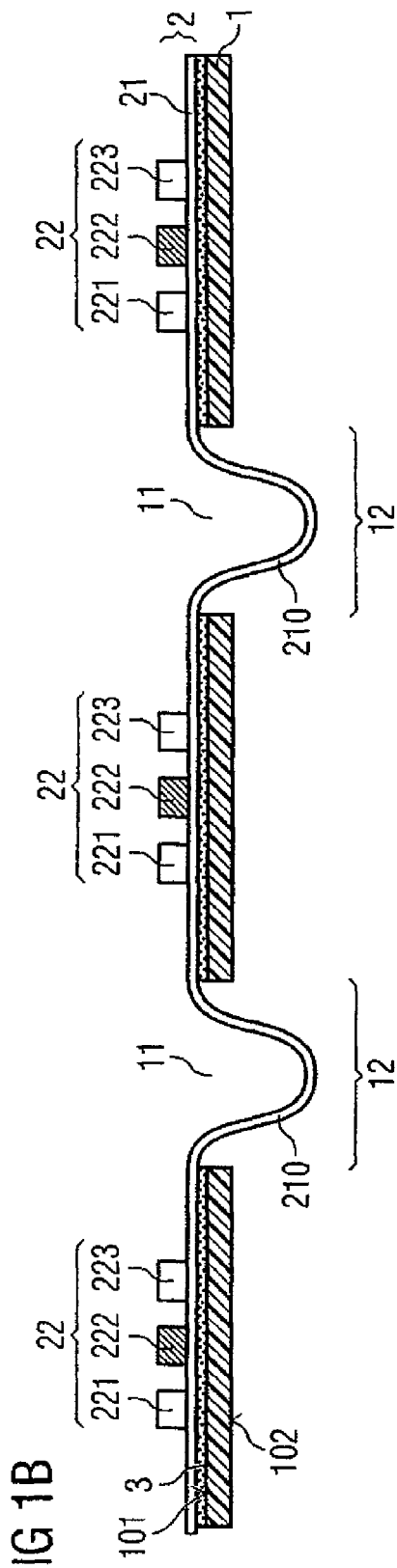

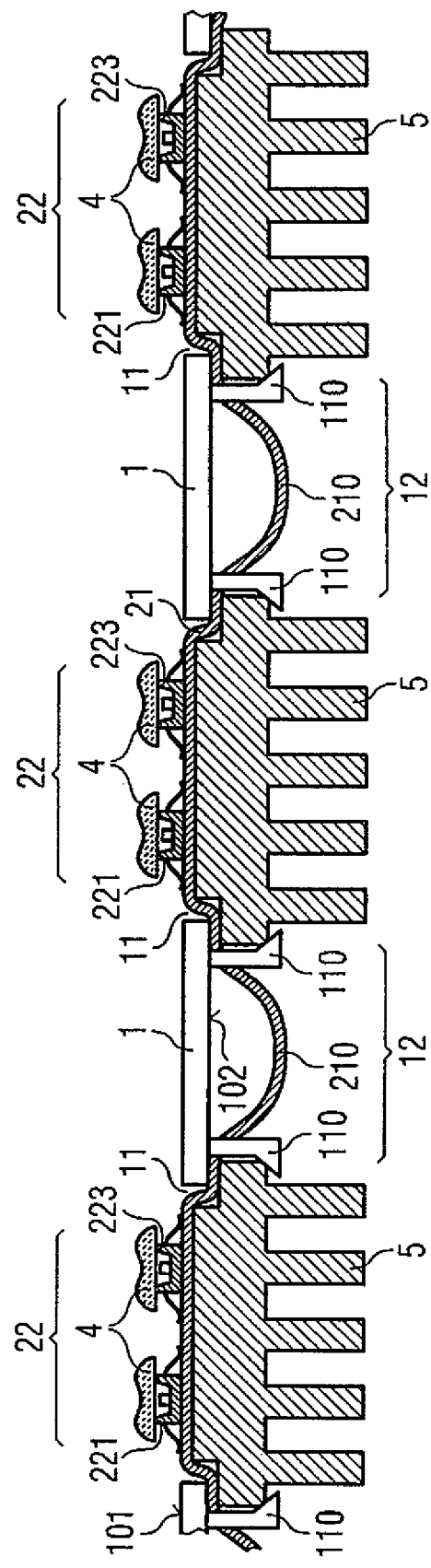

LIGHTING DEVICE, BACKLIGHTING DEVICE, AND DISPLAY DEVICE

RELATED APPLICATIONS

This is a U.S. national stage of application No. PCT/DE2008/000838, filed on May 20, 2008.

This patent application claims the priority of German Patent Application 102007023651.6 the disclosure content of which is herewith incorporated by reference.

FIELD OF THE INVENTION

The invention relates to a lighting arrangement, a backlighting device, and a display device.

SUMMARY OF THE INVENTION

One object of the invention is to provide lighting arrangements with a light module in which lighting arrangements of different dimensions and/or luminance could be produced with light modules of the same type.

A lighting arrangement according to an embodiment of the invention has at least one light module that has at least one first group of light sources and one second group of light sources that are arranged spaced apart from each other on a flexible circuit board. In one embodiment, the flexible circuit board is strip-shaped. In another embodiment, the light module has three or more groups of light sources that are arranged, for example, in a row on the flexible circuit board.

The lighting arrangement further contains a carrier, in particular a rigid carrier, on which the light module is mounted and a buffer zone between the first and the second groups of light sources, which buffer zone overlaps laterally with the light module. If the light module has three or more groups of light sources arranged in a row, in one refinement, the lighting arrangement contains a buffer zone between every two adjacent groups.

In the present context, a group of light sources has at least one light source. Preferably, it has a plurality of light sources. The lateral spacings of the light sources of one group of light sources from each other are, in particular, less than the lateral spacing between the first and the second groups. For example, the lateral spacing of the first group from the second group is at least twice as large as the greatest lateral spacing of two light sources within one of the groups of light sources.

In one embodiment, the first and/or the second group of light sources has at least one light source that emits, during operation of the lighting arrangement, red, green, blue, or white light. In one embodiment, the lighting arrangement is provided for emitting white light. In such an embodiment, for example, the first group of light sources and the second group of light sources each has at least one light source that is provided for emitting red light, one light source that is provided for emitting green light, and one light source that is provided for emitting blue light. Alternatively or additionally, the first and/or the second group of light sources may have a light source that is provided for emitting white light.

In an expedient embodiment, the flexible circuit board has, in the region of the buffer zone, a bend and/or a fold. For example, the flexible circuit board has the bend and/or fold on the back side of the carrier. In one refinement, the flexible circuit board has a U-shaped bend between the first and the second group of light sources. In other words, the flexible circuit board describes, in the course of the first to the second group of light sources—in particular on the back side of the carrier—an arc running initially away from the carrier and, in the further course, back toward the carrier.

The spacing between the first and the second group of light sources of the light module is set by means of the bend and/or the fold of the flexible circuit board in the buffer zone. In this way, the same light module is suitable for lighting arrangements in which the first and the second group of light sources have different spacings. For example, the size of the U-shaped bend is selected as a function of the lateral spacing of the mounting positions provided on the carrier for the first and the second group of light sources. Thus, lighting arrangements with different dimensions and/or luminance values are producible with the same light modules, so that an especially economical production of the lighting arrangement is achieved. In the case of the lighting arrangement, in addition, an especially small spacing of the first and second group of light sources and thus an especially high luminance can be achieved.

In one embodiment, the lighting arrangement is provided for emission from a front side of the carrier and the flexible circuit board runs in the region of the buffer zone, at least in some places, at a back side of the carrier, the back side being arranged opposite the front side. For example, in this way the risk is reduced that the flexible circuit board, in particular its bend and/or fold in the buffer zone, shades the light emitted by the light sources during operation.

In one embodiment of the lighting arrangement, the first and the second groups of light sources are arranged on a front side of the carrier. In one embodiment of this embodiment, the carrier has an opening or at least a recess in the region of the buffer zone. In the case of a lighting arrangement with a light module with three or more groups of light sources arranged in a row and a buffer zone arranged between every two adjacent groups the carrier according to this embodiment has a plurality of openings or recesses, wherein an opening or recess is arranged between every two adjacent groups of light sources of the light module.

In particular, the flexible circuit board runs through the opening to a back side of the carrier, the back side being arranged opposite the front side. For example, the flexible circuit board runs, starting from the first group of light sources, from the front side of the carrier through the opening to the back side of the carrier and, in the further course toward the second group of light sources, again through the opening of the carrier back to its front side. If the carrier has, instead of an opening, a recess, then the bend and/or fold of the flexible circuit board is, in particular, contained partially or completely in the recess.

In an alternative embodiment, in a top view of the carrier, the first group of light sources is arranged in an opening of the carrier. In an expedient embodiment, the carrier has a further opening in which the second group of light sources is arranged. In this embodiment, the buffer zone expediently lies between the opening in which the first group of light sources is arranged and the further opening in which the second group of light sources is arranged. If the light module contains three or more groups of light sources, in one embodiment, exactly one opening of the carrier is allocated to each group.

In one development of this embodiment, at least the first group of light sources is arranged at the front side of the carrier. In one preferred embodiment, the flexible circuit board runs at least in some places at the back side of the carrier. In particular, it runs on the back side of the carrier in the region of the buffer zone. It is also conceivable that the first group of light sources is likewise arranged at the back side of the carrier and emits light through the opening to the front side of the carrier during operation of the lighting arrangement.

In one embodiment, the lighting arrangement has at least one heat sink on the back side of the carrier. If the first group of light sources is arranged in the opening of the carrier, in one refinement of the lighting arrangement, the heat sink overlaps laterally with the first group of light sources and with the opening.

In a further embodiment, the light module is bonded and/or clamped with the carrier. In one refinement of this embodiment, the first group of light sources is locked in position with the carrier by means of the heat sink. In one refinement, the opening of the carrier is alternatively or additionally closed dust-tight by means of the heat sink. By means of the assembling the light module from the back side of the carrier and locking in position by means of the heat sink, the production of the lighting arrangement is especially simple and can be automated in an easy way.

In one embodiment of the lighting arrangement, at least one of the light sources of the first and/or second group of light sources has a light-emitting semiconductor chip. The light-emitting semiconductor chip has a semiconductor layer stack with a pn junction, a double-hetero structure, a single quantum well structure (SQW), or a multi quantum well structure (MQW) for generating radiation. The semiconductor layer stack is based on an organic and/or an inorganic semiconductor material. One embodiment involves a so-called thin-film semiconductor chip in which the semiconductor layer stack is produced epitaxially on a growth substrate, removed from the growth substrate, and mounted, on the side facing away from the original growth substrate, on an auxiliary carrier substrate. The thin-film semiconductor chip has, at most, a thin residue of the original growth substrate. Light-emitting semiconductor chips using thin-film construction are described, for example, in publications WO 92/13281 and EP 0905797, the disclosure contents of which with respect to the thin-film construction of light-emitting semiconductor chips are incorporated herewith explicitly by reference.

In one embodiment, the light-emitting semiconductor chip is mounted directly on the flexible circuit board using so-called "chip on board" technology, for example, by means of a solder or an adhesive, in particular an electrically conductive adhesive.

In an alternative embodiment, the light-emitting semiconductor chip is comprised by a housing and/or an encapsulation of an optoelectric component and the optoelectric component is mounted on the flexible circuit board.

In another embodiment, the first group of light sources and the second group of light sources are rotated by an angle α relative to each other. In this embodiment, each of the first and the second group preferably has at least one first and one second light source. In particular, the first and the second group of light sources are constructed identically. The angle α is then given by the angle enclosed by the directions of the lateral distance vector of the first to the second light source of the first group and the lateral distance vector of the first to the second light source of the second group.

In one embodiment, the second group of light sources is rotated by the angle α relative to the first group of light sources on the flexible circuit board. Alternatively or additionally, the flexible circuit board can have, between the first and the second group of light sources—in particular in the region of the buffer zone—a fold and/or bend by means of which the first and the second groups of light sources are rotated relative to each other. In particular, the bend and/or the fold is constructed so that the sections of the flexible circuit board contained in a first segment of the light module that contains the first group of light sources and in a second segment of the light module that contains the second group of light sources run parallel to a common plane, for example, to a main surface of the carrier.

In one embodiment, the flexible circuit board has the shape of a strip having a straight edge in the elongated state of the flexible circuit board. In the region of the first group of light sources, the edge runs in a first direction, has at least one bend and/or kink in the region of the bend or fold of the flexible circuit board, and runs in a second direction in the region of the second group of light sources. The first and the second directions enclose an angle β with each other. In one refinement, the first and second groups of light sources are mounted in the same orientation on the strip and the angle β equals the angle α.

In another embodiment of the lighting arrangement, this has a reflective film or plate that covers the carrier and/or the light module, at least in places. For example, the reflective film or plate is arranged on a front side of the carrier and covers this carrier practically completely. It has openings through which, in particular, the light sources of the first and second groups of light sources project or at least radiate.

A backlighting device according to the invention has a lighting arrangement according to at least one of the embodiments described above. For example, it involves a backlighting device for a display device.

A display device according to the invention has at least one backlighting device with a lighting arrangement according to at least one of the embodiments described above.

In one embodiment, the display device has an image-generating display unit that is backlighted, in particular directly back-lighted, by the lighting arrangement during operation.

For example, the image-generating display unit contains an LCD panel (LCD—liquid crystal display), that is, a display field based on liquid-crystal cells with a plurality of image points. For example, the display device represents an LCD television set.

BRIEF DESCRIPTION OF THE DRAWINGS

FIG. 1A shows a schematic perspective view of a cutout of a lighting arrangement according to a first embodiment, FIG. 1B shows a schematic section diagram of a cutout of the lighting arrangement according to the first embodiment, FIG. 2A shows a schematic section diagram of a lighting arrangement according to a second embodiment.

DETAILED DESCRIPTION OF THE DRAWINGS

Figure 2B:
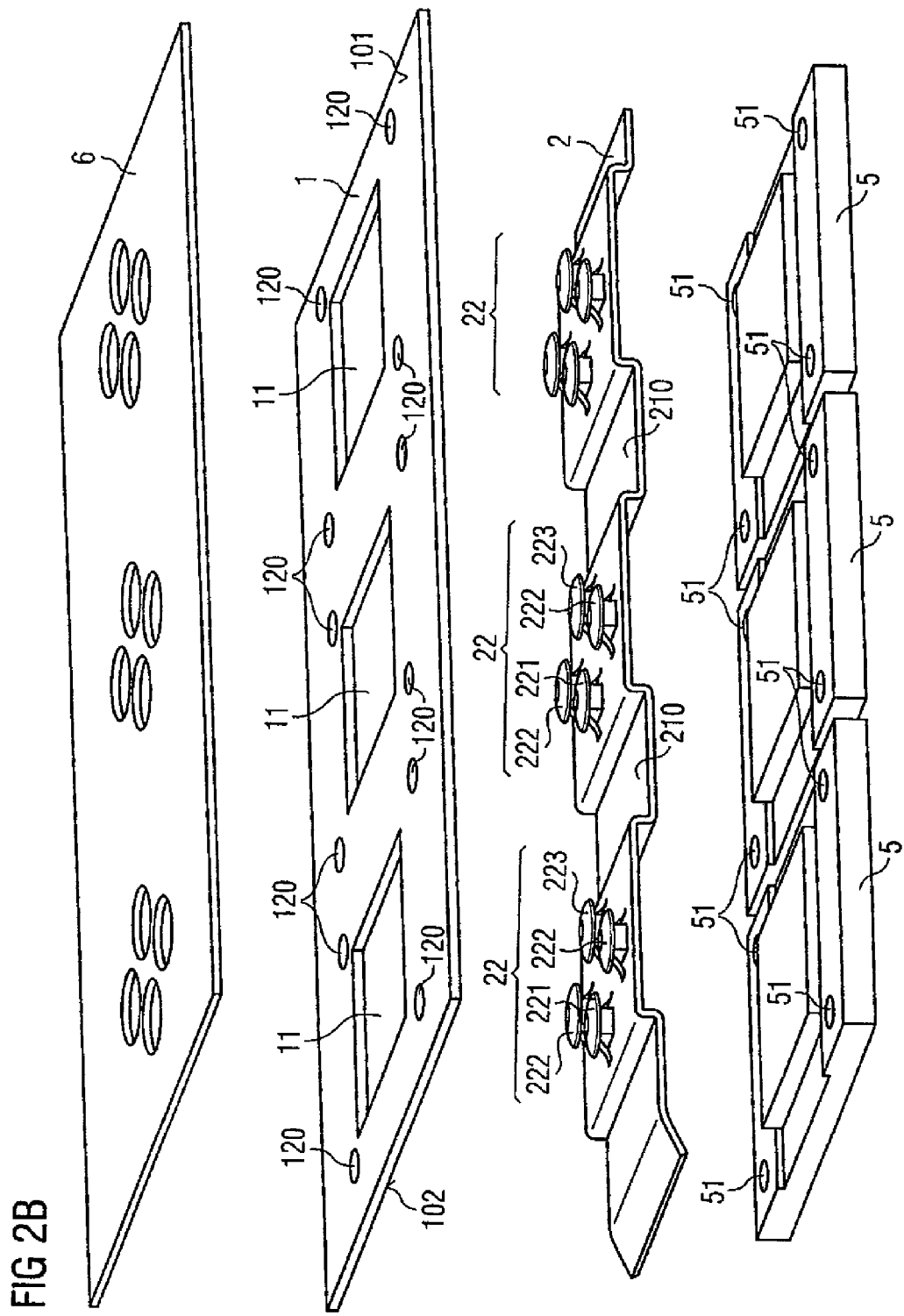
FIG. 2B shows a schematic exploded-view diagram of the lighting arrangement according to the second embodiment.

In the embodiments and figures, components of the same kind or similarly acting components are provided with the same reference symbols. The figures and the dimensional relationships of the elements shown in the figures are generally not to be considered as true to scale. Instead, individual elements can be shown excessively large and/or thick for better illustration and/or for better understanding.

FIG. 1A shows a schematic perspective view of a cutout of a lighting arrangement according to a first embodiment. FIG. 1B shows a schematic section diagram of this cutout.

The lighting arrangement has a carrier 1. The lighting arrangement further has a light module 2 that contains a flexible circuit board 21. The flexible circuit board 21 in the present case is constructed strip-shaped. A strip-shaped construction is understood in the present context to be that the length of the flexible circuit board 21 is greater than its width. Advantageously, the length in the elongated state of the flexible circuit board 21 is at least 2-times, especially preferred, at least 10-times as large as the width.

The flexible circuit board 21 contains, for example, a base body that is formed from an electrically insulating material. For example, the base body contains or is composed of at least one of the following materials: polyimide, pethylene naphthalate, polyethylene. Electrical conductor tracks are structured on the electrically insulating base body. For example, the conductor tracks are printed on the electrically insulating base body.

Several light-emitting semiconductor chips 221, 222, 223 are mounted as light sources on the flexible circuit board 21. The light-emitting semiconductor chips in the present case are mounted mechanically and contacted electrically directly with the track conductors of the flexible circuit board 21. The flexible circuit board 21 is advantageously unrolled from a roll for mounting the light-emitting semiconductor chips 221, 222, 223 and wound back onto a roll after mounting of the light-emitting semiconductor chips 221, 222, 223. In other words, the flexible circuit board 21 is equipped with the light sources in a "roll-to-roll" process. This allows an especially simple production and handling of the light module.

The light-emitting semiconductor chips 221, 222, 223 are assembled on the flexible circuit board 21 into groups 22 of light sources. The groups of light sources 22 are arranged in a row on the strip-shaped flexible circuit board 21 and in the present case follow one after the other in the longitudinal direction of the strip. The lateral spacings of the light sources within a group 22 are expediently smaller than the lateral spacing of two adjacent groups 22 of light sources of the light module 2. Preferably, the spacing of two adjacent groups 22 of light sources of the light module 2, in particular in the elongated state of the flexible circuit board 21, is twice as large, especially preferred, 5-times as large, as the spacing of two adjacent light sources 221, 222 or 222, 223 within a group 22.

In the light module 2 according to the first embodiment, each group 22 has a red-light-emitting semiconductor chip 221, a green-light-emitting semiconductor chip 222, and a blue-light-emitting semiconductor chip 223.

In one embodiment, the light module has a control device that is provided to control the light sources of the light module 2. The control device (not shown in the figures) can likewise be arranged, for example, on the flexible circuit board 21. In one refinement, the control device is provided to control the light sources 221, 222, 223, or at least the groups 22 of light sources, individually. In another refinement, the control device is also provided to control the operating current of the light sources 221, 222, 223 as a function of measurement values, such as the intensity and/or the chromaticity coordinate of the light emitted by the light sources 221, 222, 223 during operation of the lighting arrangement. For this purpose, for example, at least one sensor such as, for example, a photodiode (not shown in the figures), may be arranged on the flexible circuit board 21.

Between a first and a second group 22 of light sources, in the present case between every two adjacent groups 22 of light sources of the light module 2, the lighting arrangement has a buffer zone 12. The carrier 1 has an opening 11 in each buffer zone 12. The buffer zones 12 with the openings 11 overlap laterally with the flexible circuit board 21 of the light module 2.

The groups of light sources 22 are arranged on a front side 101 of the carrier 1. The flexible circuit board 21 runs between the two adjacent groups of light sources 22 through the opening 11 from the front side 101 to a back side 102 of the carrier 1 opposite the front side. In the region of the opening 11, it has a U-shaped bend 210. By means of the U-shaped bend 210 of the flexible carrier 21, the lateral spacing of the groups 22 of light sources can be adjusted across a wide range. Different carriers 1 whose mounting positions for the groups 22 of light sources and/or whose openings 11 have different spacings can be used with the same light module. In this way, the light module 2 can be used in an especially flexible way, by means of which an economical production of the lighting arrangement is achieved.

In the present embodiment, the light module 2 is mounted on the carrier 1 by means of a double-sided adhesive tape 3. More precisely, a surface of the flexible circuit board 21 facing away from the light sources is bonded in some places by means of the double-sided adhesive tape 3 on a front-side main surface of the carrier 1. Alternatively, the flexible circuit board 21 itself may be provided with an adhesive layer on its side facing away from the light sources 221, 222, 223. As another alternative, laminating the flexible circuit board 21 on the carrier 1 is conceivable.

In a refinement of the first embodiment, the lighting arrangement has at least one additional light module 2 that runs, in particular, at least in some regions, parallel to the first light module 2. The lighting arrangement is constructed, in the region of the additional light module 2, advantageously analogous to the cutout shown in FIGS. 1A and 1B.

FIGS. 2A and 2B show a second embodiment of a lighting arrangement in a schematic section diagram and in an exploded-view diagram.

In contrast to the first embodiment, in the second embodiment, optoelectronic components 221, 222, 223 are used as light sources. These contain a light-emitting semiconductor chip that in the present case is contained in a housing and that is encapsulated, in particular, with a sealing compound. The optoelectronic components 221, 222, 223 in the present case involve components that can be surface mounted, so-called SMT components (SMT—surface mounting technology).

The optoelectronic components 221, 222, 223 in the present case each have a lens 4 through which light emitted by the semiconductor chip during operation is coupled out from the component. For example, a radiation-exit surface of the lens 4 has a concave sub-region through which runs an optical axis of the lens. In particular, the lens 4 also has a convex sub-region that surrounds the concave sub-region with a spacing to the optical axis. An optoelectronic component with such a lens 4 has emission characteristics in which the out-coupled radiation output is advantageously especially high at large angles to the optical axis. In this way, light of a plurality of light sources of the lighting arrangement is advantageously mixed and a homogeneous illumination of a relatively large, in particular flat, surface is achieved by the lighting arrangement.

Figure 4:
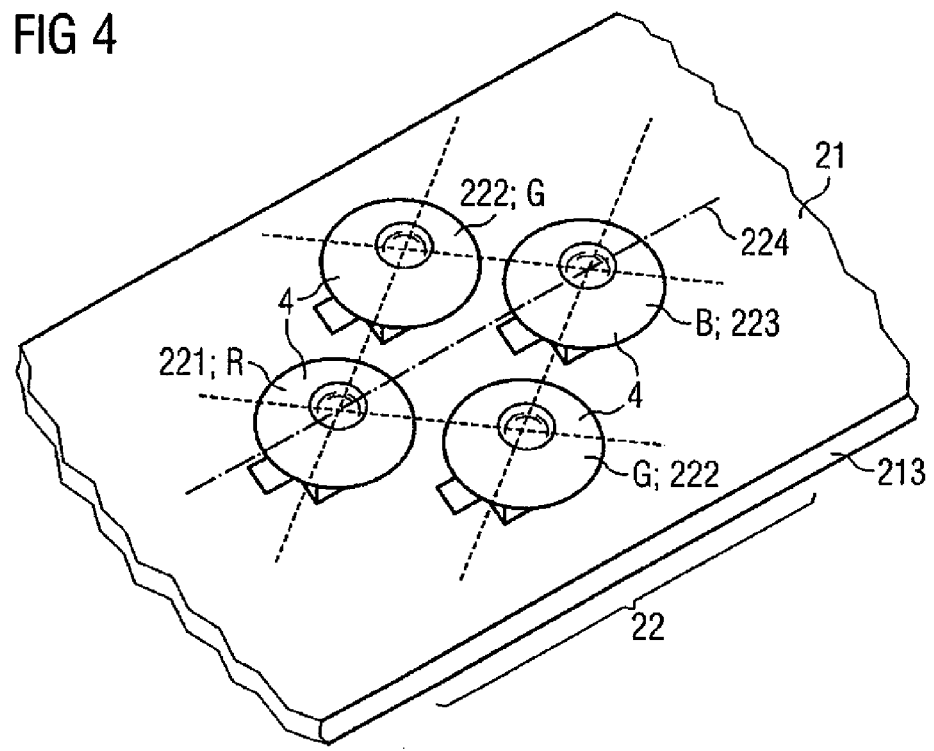
FIG. 4 shows a schematic perspective view of a group of light sources of the lighting arrangement according to the second embodiment.

In the present invention, each group 22 of light sources contains four light sources in contrast to the first embodiment. FIG. 4 shows a schematic perspective diagram of one of the groups 22 of light sources. The group 22 contains a red-light-emitting light source 221/R, two green-light-emitting light sources 222/G, and a blue-light-emitting light source 223/B.

Each group 22 of light sources and thus also the lighting arrangement is suitable for generating during operation a color impression in the vicinity of the white point in the CIE standard chromaticity diagram.

Another difference with respect to the first embodiment is that in the present case each group 22 of light sources is arranged, in a top view of the front side 101 of the carrier 1, in an opening 11 of the carrier 1. Each of the groups of light sources 22 is in the present case locked in position by a heat sink 5 in the opening 11. For example, the heat sink 5 involves a metallic body; for example, the heat sink 5 comprises or consists of aluminum.

The heat sink preferably has a surface that is adjacent to the group of light-emitting diodes 22 and that, in particular, directly borders the flexible circuit board 21 or on which the flexible circuit board 21 is mounted, for example with an adhesive layer or a double-sided adhesive tape 3. The side of the heat sink 5 facing the group 22 of light sources advantageously has a flat surface on which the flexible circuit board 21 is mounted or that adjoins the flexible circuit board 21. Thus, good thermal coupling is achieved. As in the present embodiment, the side of the heat sink facing the group 22 of light sources can also have one or more clearances, for example in an edge region, in which clearances the flexible circuit board 21 runs. On the side facing away from the group 22 of light sources, the heat sink 5 in the present case has projections, for example, fin-like projections by means of which an especially efficient dissipation of loss heat is achieved.

The light module 2 advantageously projects from the back side 102 of the carrier 1 into the opening 11 or, especially preferably, runs from the back side 102 through the opening 11 to the front side 101. In particular, the light sources 221, 222, 223 project beyond the front-side main surface 101 of the carrier 1. For example, during production of the lighting arrangement, the flexible carrier 21 is pressed into the opening or through the opening by means of the heat sink 5.

The locking in position is realized, for example, by means of holding elements 110 that are formed, for example, on the back side 102 of the carrier 1. In one embodiment, a so-called snap-on or clip-on connection is produced by means of the holding elements 110, in which the flexible holding elements 110 hook with the heat sink. This is shown as an example in FIG. 2A. In FIG. 2B, an alternative embodiment is shown in which the carrier 1 has boreholes 120 and the heat sink 5 has threaded boreholes 51 or vice versa. Accordingly, in this embodiment, a screw connection is expediently formed between the carrier 1 and the heat sink 5.

In an advantageous refinement, the opening 11 of the carrier 1 is closed dust-tight by means of the heat sink 5. For example, a rubber seal is arranged for this purpose between the carrier 1 and an edge region of the heat sink 5 (not shown in the figures), wherein the rubber seal is pressed by the heat sink onto the carrier and/or onto the flexible circuit board 21 in the assembled state.

Between every two adjacent groups 22 of light sources, the lighting arrangement has a buffer zone 12 that overlaps with the light module 2. In other words, the flexible circuit board 21 runs in the buffer zone 12 on the back side 102 of the carrier 1. There it forms a U-shaped bend 210, so that the light module, as in the first embodiment, is suitable for lighting arrangements with different spacings between adjacent groups 22 of light sources. The flexible circuit board 21 advantageously does not obstructs or only slightly obstructs the dissipation of heat from cooling bodies 5 on the back side 102 of the carrier.

In the case of the lighting arrangement according to the second embodiment, a reflective film 6 is arranged on the front side 101 of the carrier, as shown in FIG. 2B. In FIG. 2A, the reflective film 6 is left out for a simplified diagram.

The reflective film 6 in the present case covers the front-side main surface of the carrier 1 completely or at least practically completely. In a top view of the front side 101 of the carrier 1, the reflective film 6 also covers the flexible circuit board 21 in some places. For each of the light sources 221, 222, 223, the reflective film 6 has an opening through which the light source 221, 222, 223 projects. The reflective film 6 expediently is constructed in a diffusely reflective or mirrored fashion at least on its side facing away from the carrier 1.

Figure 3:
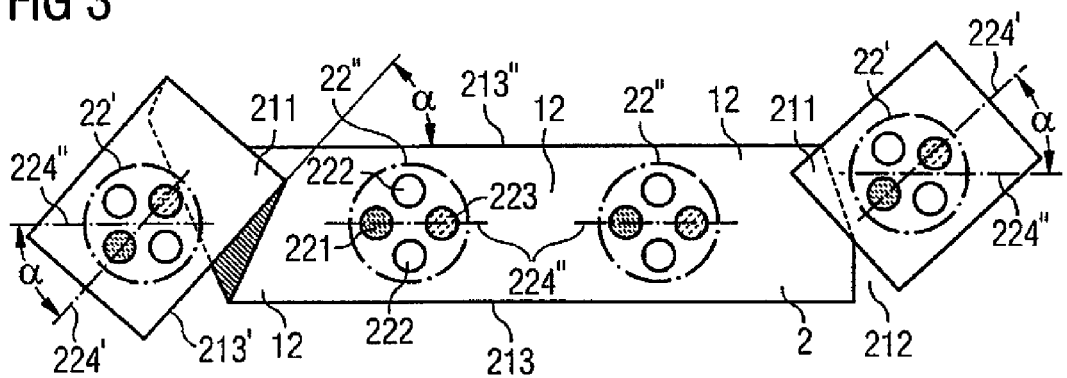
FIG. 3 shows a schematic top view of a light module according to another embodiment.

In FIG. 3, a schematic top view is shown of a light module 2, as it is used in the second embodiment. The light module 2 in the present case has first groups 22' of light sources that are rotated relative to the second groups 22".

In the embodiment of FIG. 3, all groups 22', 22" of light sources are mounted in the same orientation on the flexible circuit board 21. In particular, the direction of the lateral distance vector between the red light source 221 and the blue light source 223 is parallel to the edges 213 of the flexible circuit board 21. This direction is marked in FIG. 3 by the line 224' or 224" and in FIG. 4 by the line 224. In the elongated state of the strip-shaped, flexible circuit board 21, the edges 213 run parallel to each other in the longitudinal direction of the strip.

Between a first group of light sources 22' and a second group of light sources 22", the flexible circuit board 21 has a fold 211, as shown, as an example, in the left region of FIG. 3. Alternatively, it could have a notch 212 and a bend or fold 211, as shown, as an example, in the right region of FIG. 3. In this way, the first group 22' of light sources is rotated relative to the, in particular, adjacent, second group 22" of light sources by an angle. Sections of the flexible circuit board 21 on which the first or the second group 22', 22" are arranged preferably run parallel to a common plane. In other words, the flexible circuit board 21 advantageously lies flat apart from the fold and/or bend 211 between the first and the second group 22', 22" and apart from the U-shaped bends 210 which are not shown in FIG. 3.

The angle α is given, for example, by the angle between the directions 224' and 224". Because in the present case the first and second groups 22', 22" of light sources are mounted in the same orientation on the flexible circuit board 21 and the circuit board 21 represents a straight strip, the direction of the edges 213' of the section of the flexible circuit board 21 on which the first group 22' of light-emitting diodes is arranged and the direction of the edges 213" of the section of the flexible circuit board on which the second group 22" of light-emitting diodes is arranged enclose the angle α. The angle α equals, for example, 45, 60, or 90°.

With a rotated first group 22' of light sources, for example, the emission characteristics are changed in an edge region of the lighting arrangement. This can be preferable, for example, in order to increase the homogeneity in edge regions of a backlighting device, as described in more detail below.

Figure 5:
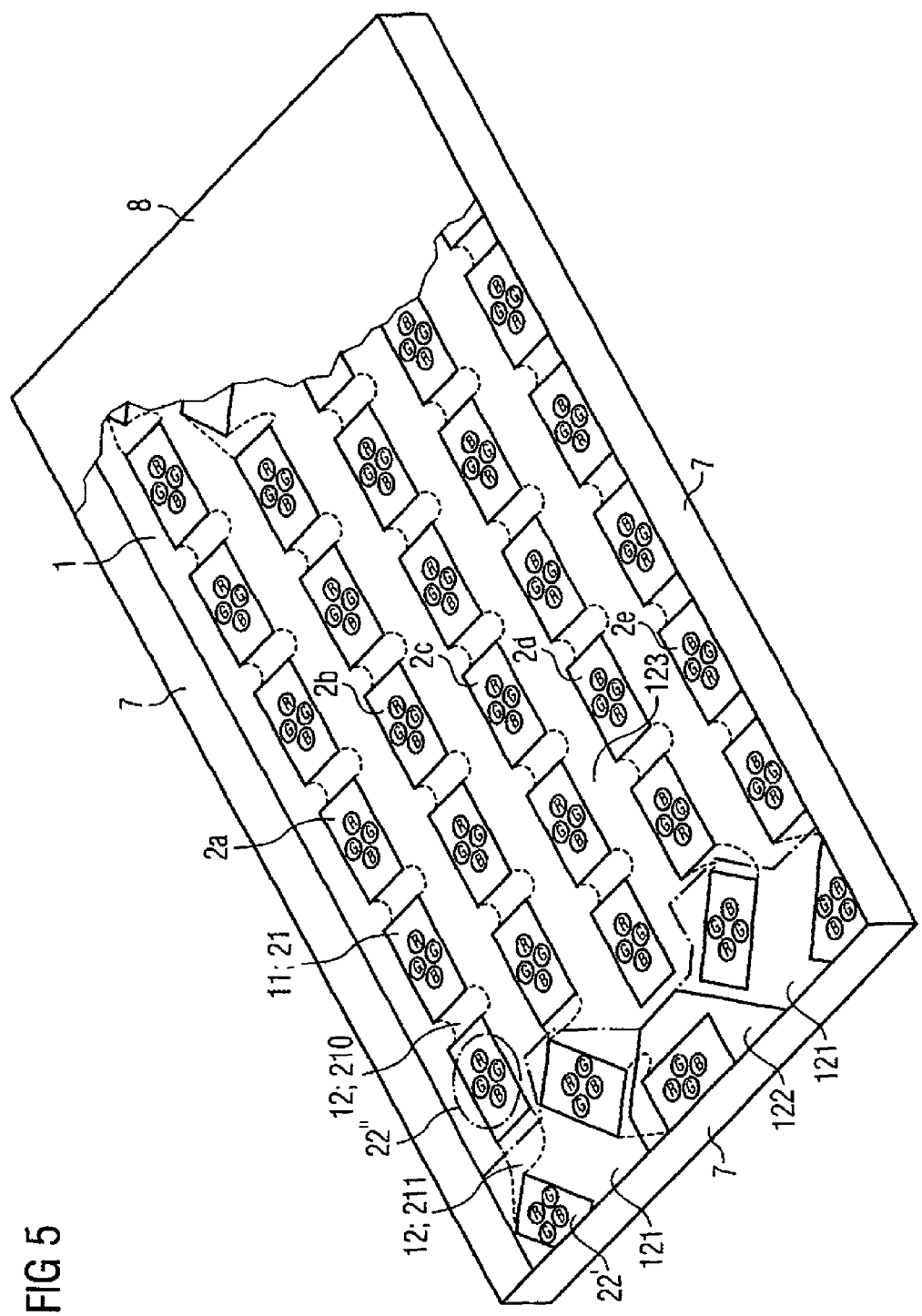
FIG. 5 shows a schematic perspective view of an embodiment of a backlighting device.

FIG. 5 shows an embodiment of a backlighting device. The backlighting device has a lighting arrangement that is constructed analogous to the second embodiment of the lighting arrangement described above. In contrast to this embodiment, the lighting arrangement in the present case has, however, a plurality of light modules 2a, 2b, 2c, 2d, and 2e.

The backlighting device according to the embodiment of FIG. 5 has, in addition to the carrier 1 that in the present case represents a rear wall of the backlighting device, peripheral side walls 7 and a translucent plate 8 that is shown cut in FIG.

5. Together with the carrier 1 and the side walls 7, the translucent plate 8 borders an inner space of the backlighting device. For example, it involves a milky-white plate or a diffuser plate that is formed, for example, from plastic. Alternatively, the translucent plate 8 may also be transparent. It may be structured and/or printed, in order to scatter the light of the light sources 221, 222, 223.

The light modules are oriented so that they run parallel to each other in a middle region 123 of the carrier 1. In other words, the strip-shaped flexible circuit boards 21 of the light modules 2a, 2b, 2c, 2d, 2e are oriented parallel to each other in the middle region 123 in a top view of the front side 101 of the carrier.

As shown in the embodiment of FIG. 3, groups 22 of light sources are rotated in corner regions 121 and edge regions 122 of the carrier 1 by an angle α relative to the groups 22 of light sources arranged in the middle region 123 of the carrier 1. For example, the groups 22 arranged in the corner regions 121 are rotated by α=45° relative to the groups 22 arranged in the middle region 123, and groups arranged in an edge region 122 arranged between two corner regions 121 are rotated by α=90° relative to the groups arranged in the middle region 123. In the present case, the edge region contains only one group 22 of light sources. In one alternative embodiment, the lighting device has no edge region 122 in which the groups 22 of light sources are rotated by 90° relative to the groups 22 arranged in the middle region 123.

For example, in the first light module 2a, the first group 22' is arranged in one of the corner regions 121 relative to the following group 22", which is arranged in a middle region 123, rotated by an angle α of, for example, 45°. In the present case, the last group at the end of the light module 2a opposite that of the first group 22' is also rotated by 45° versus the group 22 adjacent to it that is arranged in the present case in the middle region 123 of the carrier 1.

In the second light module 2b, for example, the first group 22 of light sources is arranged in the middle edge region 122 and thus in the present case rotated by an angle of 90° relative to the groups 22 arranged in the middle region 123. Another group 22 of light sources, for example the group 22 following the first group 22, is arranged in one of the corner regions 121 and rotated relative to the groups 22 arranged in the middle region by an angle of, for example, 45°.

For example, the groups 22 of light sources of the third light module 2c in the present case all have the same orientation.

The arrangement of light sources, groups of light sources, and the light modules, however, is naturally not limited by the arrangement shown in FIG. 5 to this arrangement.

By means of the groups 22 of light sources arranged in the corner and edge regions 121, 122, in these regions 121, 122 an especially homogeneous backlighting of the surface area to be illuminated is achieved. The backlighting device takes advantage of the idea that, by means of the mutually rotated groups of light sources 22, 22' in the edge regions or corner regions 121, 122, light of each color illuminates onto the edge—in particular the side surfaces 7 with the smallest possible shading by other light sources.

In a preferred embodiment, the groups 22 of light sources are arranged at least in the middle region 123 at the grid points of an imaginary grid. For example, the grid may be a hexagonal or rectangular grid. Embodiments for the arrangement of light sources and groups of light sources in a lighting arrangement or backlighting device are contained in publication WO 2006/076899 A2 the disclosure content of which in this respect is incorporated herewith by reference.

The backlighting device is suitable, for example, as a backlighting device for a display device, such as an LCD television set.

The invention is not limited by the description with reference to the embodiments to these embodiments. Instead, the invention includes any new feature as well as any combination of features, which contains, in particular, any combination of features in the claims, even if this feature or this combination itself is not explicitly disclosed in the claims or embodiments.

The invention claimed is:

1. A lighting arrangement with a light module comprising:
at least one first group of light sources and one second group of light sources arranged spaced apart from each other on a flexible circuit board;
a carrier on which the light module is mounted; and
a buffer zone between the first and the second group of light sources, which buffer zone laterally overlaps with the light module;
wherein at least one of the light sources includes a light-emitting semiconductor chip; and
wherein the light-emitting semiconductor chip is comprised in at least one of a housing and an encapsulation of an optoelectronic component, and the optoelectronic component is mounted on the flexible circuit board.

2. The lighting arrangement according to claim 1, wherein the flexible circuit board includes a bend or a fold on a back side of the carrier, in a region of the buffer zone.

3. The lighting arrangement according to claim 2, wherein the flexible circuit includes a U-shaped bend on the back side of the carrier, in the region of the buffer zone.

4. The lighting arrangement according to claim 1, wherein the lighting arrangement emits light from a front side of the carrier, and wherein, in a region of the buffer zone, the flexible circuit board extends, at least in some places, at a back side of the carrier, the back side being arranged opposite the front side.

5. The lighting arrangement according to claim 2, wherein the first and the second groups of light sources are arranged on a front side of the carrier, the carrier includes, in the region of the buffer zone, an opening, and the flexible circuit board extends through the opening to the back side of the carrier, the back side being arranged opposite the front side.

6. The lighting arrangement according to claim 1, wherein, in a top view of the carrier, the first group of light sources is arranged in an opening of the carrier.

7. The lighting arrangement according to claim 6, wherein, in a top view of the carrier, the second group of light sources is arranged in a further opening and the buffer zone is arranged between the opening and the further opening.

8. The lighting arrangement according to claim 6, wherein a heat sink is arranged on a back side of the carrier and laterally overlaps with the first group of light sources and the opening.

9. The lighting arrangement according to claim 1, wherein the light module is at least one of bonded and clamped with the carrier.

10. The lighting arrangement according to claim 8, wherein the first group of light sources is locked in position with the carrier by the heat sink.

11. The lighting arrangement according to claim 1, wherein the light-emitting semiconductor chip is mounted directly on the flexible circuit board.

12. The lighting arrangement according to claim 1, wherein the first group of light sources and the second group of light sources are rotated by an angle α relative to each other.

13. The lighting arrangement according to claim 12, wherein the flexible circuit board includes at least one of a fold and bend between the first and the second group of light sources.

14. The lighting arrangement according to claim 1, further comprising:
   a reflective film or plate that covers at least one of the carrier and the light module, at least in places.

15. A backlighting device for a display device with a lighting arrangement according to claim 1.

16. A display device with a backlighting device according to claim 15.

17. A display device according to claim 16, further comprising:
   an image-generating display unit that is backlighted during operation by the lighting arrangement.

18. The display device according to claim 16, wherein the display unit is an LCD panel.

* * * * *